(12) United States Patent
Ogawa et al.

(10) Patent No.: US 8,513,602 B2
(45) Date of Patent: Aug. 20, 2013

(54) FOCUSED ION BEAM APPARATUS

(75) Inventors: Takashi Ogawa, Chiba (JP); Kenichi Nishinaka, Chiba (JP); Yoshihiro Koyama, Chiba (JP)

(73) Assignee: SII Nanotechnology Inc., Chiba (JP)

( * ) Notice: Subject to any disclaimer, the term of this patent is extended or adjusted under 35 U.S.C. 154(b) by 392 days.

(21) Appl. No.: 12/712,863

(22) Filed: Feb. 25, 2010

(65) Prior Publication Data

US 2010/0219339 A1 Sep. 2, 2010

(30) Foreign Application Priority Data

Feb. 27, 2009 (JP) ................................. 2009-046366

(51) Int. Cl.
*H01J 37/00* (2006.01)
(52) U.S. Cl.
USPC ........ 250/309; 250/306; 250/307; 250/423 R; 250/424; 250/492.1
(58) Field of Classification Search
USPC .................. 250/306, 307, 309, 423 R, 423 F, 250/424, 425, 492.1, 492.2, 492.21, 492.3
See application file for complete search history.

(56) References Cited

U.S. PATENT DOCUMENTS 7,601,953 B2 * 10/2009 Ward et al. .................... 250/309
2007/0051900 A1 * 3/2007 Ward ........................ 250/423 R

FOREIGN PATENT DOCUMENTS

| JP | 07-240165 A | 9/1995 |
|----|----|----|
| JP | 2008-261815 A | 10/2008 |
| JP | 2008-262879 A | 10/2008 |
| WO | WO 2007/067328 A2 | 6/2007 |
| WO | WO 2007/067328 A3 | 6/2007 |

* cited by examiner

*Primary Examiner* — Robert Kim
*Assistant Examiner* — Hanway Chang
(74) *Attorney, Agent, or Firm* — Brinks Hofer Gilson & Lione

(57) ABSTRACT

The crystal structure of the emitter can be accurately grasped from a FIM image without being influenced by disturbances, such as contamination, and even if the rearrangement of atoms has been performed, whether or not the crystal structure of the emitter has returned to the original state can also be accurately determined. There is a provided a focused ion beam apparatus including an emitter 10, a gas source 11 which supplies gas G2, a cooling unit 12 which cools the emitter, a heating unit 13 which heats the tip of the emitter, an extraction power source unit 15 which applies an extraction voltage to ionize the gas into gas ions at the tip of the emitter, and then extract the gas ions, a beam optical system 16 which makes the extracted gas ions into a focused ion beam (FIB), and then radiates the focused ion beam onto a sample S, an image acquiring mechanism 17 which acquires a FIM image of the tip of the emitter, and a control unit 7 having a display unit and a storage unit 7*b*. A guide which displays an ideal crystal structure of the tip of the emitter is stored in advance in the storage unit. The control unit is enabled to display the guide in the state of overlapping the acquired FIM image on the display unit.

14 Claims, 22 Drawing Sheets

FOCUSED ION BEAM APPARATUS

RELATED APPLICATIONS

This application claims priority under 35 U.S.C. §119 to Japanese Patent Application No. 2009-046366 filed on Feb. 27, 2009, the entire content of which is hereby incorporated by reference.

FIELD OF THE INVENTION

The present invention relates to a focused ion beam apparatus which has a gas field ion source.

Conventionally, a focused ion beam apparatus is known as an apparatus for conducting observation various kinds of evaluation, analysis, etc. of samples, such as a semiconductor device, or taking out a fine flake sample from a sample and then, fixing this flake sample to a sample holder, to prepare a TEM sample.

This focused ion beam apparatus includes an ion source which generates ions, and the ions which are generated in this ion source are radiated as a focused ion beam (FIB) afterward.

DESCRIPTION OF RELATED ART

There are several kinds of ion sources as the ion source. Although, for example, a plasma type ion source, a liquid metal ion source, etc. are known, a gas field ion source (GFIS), which can generate a high-luminance focused ion beam with a smaller beam diameter than these ion sources, is provided.

This gas field ion source mainly includes a needlelike emitter whose tip is sharp-pointed at the atomic level, a gas source which supplies gas, such as helium (He), to the periphery of the emitter, a cooling unit which cools the emitter, and an extraction electrode which is disposed at a position apart from the tip of the emitter.

In such a configuration, when an extraction voltage is applied to between the emitter and the extraction electrode, and the emitter is cooled after gas is supplied, the gas is field-ionized into gas ions by high electric field of the tip of the emitter. Then, the gas ions are repelled from the emitter maintained at positive potential, and are extracted towards the extraction electrode. Thereafter, the extracted gas ions are moderately and accelerated and focused into a focused ion beam.

Especially, since the focused ion beam generated from the gas field ion source has a small beam diameter and small energy dispersion as described above, the focused ion beam can be radiated onto a sample while the beam diameter is reduced small. Accordingly, it is possible to attain a high-resolution during observation or to perform finer etching.

Meanwhile, in order to generate a focused ion beam with as small a diameter as possible, it is preferable that the crystal structure of the tip of the emitter is formed in the shape of a pyramid, and one atom is arrayed at the foremost end when possible. By doing so, it is possible to ionize gas into gas ions at one point. Thus, a focused ion beam with a small beam diameter can be generated. Accordingly, it is important that the above-mentioned crystal structure is always stably maintained at the tip of the emitter.

Thus, an apparatus in which a mechanism capable of observing an emission pattern image (FIM image), i.e., a field ion image, of the tip of the emitter, is incorporated into a lens barrel which radiates a focused ion beam is known (refer to JP-A-7-240165).

This apparatus includes a microchannel plate (MCP) which has a rear surface side used as a fluorescent screen, and is disposed on the optical axis of the focused ion beam. Thereby, the focused ion beam enters the fluorescent screen after being amplified by the MCP. Therefore, a FIM image can be projected on the fluorescent screen. Additionally, this FIM image is displayed after being guided to a CCD camera by a mirror. Accordingly, it is possible to observe the FIM image, thereby confirming the state of the crystal structure of the tip of the emitter if necessary.

However, it is difficult to accurately grasp the crystal structure of the tip of the emitter just by observing the FIM image. Typically, gas may be intensively ionized into gas ions at a convex part of the surface of the emitter. This is because an electric field is locally strong at the convex part. Therefore, a high-luminance portion of the FIM image indicates the convex part of the surface of the emitter. However, when molecules of a contaminant have adhered to the surface of the emitter, the emission resulting from the crystal structure of the tip of the emitter and the emission resulting from the contamination will be shown as the same luminescent spot on the FIM image. Accordingly, just by observing the FIM image, it is difficult to distinguish between the emission resulting from the crystal structure of the tip of the emitter and the emission resulting from the contaminant and it is difficult to accurately grasp the crystal structure. Especially, since the contamination leads to a decrease in the stability of the ion source, it is desired to accurately distinguish the contaminant from an atom of the crystal structure.

Additionally, the crystal structure of the tip of the emitter is apt to be broken, and the structure is apt to change from its original state. Thus, in such a case, the technique of returning the crystal structure of the tip of the emitter to its original state is known. Specifically, the tip of the emitter is heated to between 800° C. and about 900° C. Then, a rearrangement of atoms is caused, whereby the crystal structure is returned to the pyramidal state, and is brought into a sharp-pointed state. Accordingly, it is preferable to perform the rearrangement of atoms periodically or as necessary and to return the crystal structure of the tip of the emitter to the original ideal state.

However, even if the rearrangement of atoms is arranged, there is a case where positive repeatability cannot necessarily be obtained each time and, depending on circumstances, the crystal structure may become imperfect. Accordingly, after the rearrangement of atoms is performed, it is necessary to accurately determine whether or not the crystal structure has returned to the original state, or is imperfect. However, it is difficult to determine even this just by seeing the FIM image. In the FIM image, only the portion with the strongest electric field can be observed. Therefore, in order to confirm the crystal structure, it is necessary to field-evaporate the emitter once and then confirm the crystal structure. However, since field evaporation is performed, the emitter is already brought into an unusable state when the confirmation of the crystal structure is ended.

Accordingly, as described above, just by seeing the FIM image, it is difficult to determine whether or not the crystal structure has returned to the original state, or is imperfect. Similarly to the above-described contamination, this problem also leads to a decrease in the stability of the ion source. Thus, accurate determination is desired.

SUMMARY OF THE INVENTION

The invention was made in consideration of such circumstances, and the object of the invention is to provide a focused ion beam apparatus capable of accurately grasping the crystal structure of the emitter from a FIM image without being influenced by disturbances, such as contamination, and capable of accurately determining whether or not the crystal structure of the emitter has returned to the original state even if the rearrangement of atoms has been performed.

In order to solve the above object, the invention provides the following means.

A focused ion beam apparatus according to the invention includes an emitter having a sharp-pointed tip, and having a pyramidal crystal structure at the tip, a gas source which supplies gas to the periphery of the emitter, a cooling unit which cools the emitter, a heating unit which locally heats the tip of the emitter to perform the rearrangement of atoms which constitute the emitter, an extraction electrode disposed apart from the tip of the emitter, an extraction power source unit which applies an extraction voltage to between the emitter and the extraction electrode to ionize the gas into gas ions at the tip of the emitter, and then extract the gas ions towards the extraction electrode, a beam optical system which makes the extracted gas ions into a focused ion beam, and then radiates the focused ion beam onto a sample, an image acquiring mechanism which acquires a FIM image of the tip of the emitter from the focused ion beam; and a control unit having a display unit which displays the acquired FIM image, and having a storage unit which stores the FIM image. A guide which displays an ideal crystal structure of the tip of the emitter is stored in advance in the storage unit. The control unit is enabled to display the guide in the state of overlapping the acquired FIM image on the display unit.

In the focused ion beam apparatus according to the invention, when a focused ion beam is radiated on a sample, gas is supplied to the periphery of the emitter from the gas source, and the emitter is cooled to a predetermined temperature by the cooling unit. In this state, when the extraction power source unit applies the extraction voltage between the extraction electrode and the emitter, the gas is field-ionized into gas ions at the tip of the emitter. Then, the gas ions are extracted towards the extraction electrode. The extracted gas ions become a focused ion beam by the beam optical system, and the focused ion beam is radiated towards the sample. Thereby, observation, processing, etc. of the sample can be performed by using the focused ion beam.

Here, when the crystal structure of the tip of the emitter is confirmed, an FIM image of the tip of the emitter is acquired by the image acquiring mechanism. After the acquired FIM image is sent to the control unit, the image is stored in the storage unit and displayed on the display unit. Consequently, the actual crystal structure of the tip of the emitter can be confirmed by observing the displayed FIM image.

Meanwhile, the guide which displays the ideal crystal structure of the tip of the emitter is stored in advance in the storage unit, and the guide is able to be displayed on the display unit in the state of overlapping the FIM image acquired by the control unit.

Consequently, the FIM image can be observed while using the guide as an indicator, and whether or not the actual crystal structure is in an ideal state (that is, a state where the tip of the emitter is pyramidal, and the foremost end includes one or several atoms) can be accurately grasped. Thereby, for example, even if a luminescent spot has appeared on the FIM image due to adhesion of a contaminant or the like, the guide is used as an indicator. Thus, it can be accurately distinguished that the luminescent spot is influenced not by an atom but by a contaminant.

Additionally, when the crystal structure of the tip of the emitter has been broken, the tip of the emitter can be locally heated by the heating unit, and the rearrangement of atoms which constitute the emitter can be performed during use. Thereby, the crystal structure of the tip of the emitter can be returned to the original pyramidal structure. Even in this case, whether or not the crystal structure has returned to the original ideal state after the rearrangement can be accurately determined by contrasting the FIM image acquired after the rearrangement, and the guide.

As described above, by using the guide, the crystal structure of the emitter can be accurately grasped without being influenced by disturbances, such as contamination, and even if the rearrangement of atoms has been performed, whether or not the crystal structure of the emitter has returned to the original ideal state can also be accurately determined. Accordingly, the gas ions can always be stably generated, and a high-luminance focused ion beam with a small beam diameter can be kept being radiated.

The focused ion beam apparatus according to the invention is a focused ion beam apparatus of the invention in which the control unit automatically determines whether or not the actual crystal structure of the tip of the emitter read from the FIM image coincides with the crystal structure displayed by the guide after the acquired FIM image and the guide overlap each other.

In the focused ion beam apparatus according to the invention, when the FIM image acquired from the image acquiring mechanism is sent, the control unit displays the guide on the display unit in a state where the guide overlaps the FIM image, and then contrasts the FIM image and the guide, thereby automatically determining whether or not the actual crystal structure of the tip of the emitter coincides with the crystal structure displayed by the guide. Accordingly, the user can accurately grasp the crystal structure of the emitter without performing a special operation. Consequently, use becomes easier and convenience can be improved.

The focused ion beam apparatus according to the invention is the focused ion beam apparatus of the above invention in which if non-coincidence is determined, the control unit controls the extraction power source unit so that the extraction voltage changes with a predetermined amplitude.

In the focused ion beam apparatus according to the invention, if the control unit determines that the actual crystal structure of the tip of the emitter does not coincide with the crystal structure displayed by the guide, the extraction power source unit is controlled to change the extraction voltage between the emitter and the extraction electrode with a predetermined amplitude. Then, an electric field increases locally at a convex part on the surface of the emitter, and field evaporation is apt to occur. Consequently, when a contaminant has adhered to the surface of the emitter, it is possible to scatter this contaminant preferentially by field evaporation. Accordingly, it is possible to provide a high-quality emitter to which a contaminant does not adhere.

The focused ion beam apparatus according to the invention is the focused ion beam apparatus of the above invention in which if non-coincidence is determined after the extraction voltage has been changed, the control unit operates the heating unit to perform the rearrangement of atoms of the emitter again.

In the focused ion beam apparatus according to the invention, if the control unit determines that the actual crystal structure of the tip of the emitter does not yet coincide with the crystal structure displayed by the guide even if the change in the extraction electrode is performed, it is determined that the crystal structure is imperfect and has not returned to the original ideal state. Consequently, the control unit makes the heating unit heat the tip of the emitter locally, thereby perform the rearrangement of atoms again. Thereby, the crystal structure of the tip of the emitter can be returned to the original ideal state.

The focused ion beam apparatus according to the invention is the focused ion beam apparatus of the above invention in which if non-coincidence is still determined even if the heating unit is operated, the control unit operates the heating unit again to perform the rearrangement of atoms of the emitter again, in a state where the heating temperature of the heating unit is raised further than before.

In the focused ion beam apparatus according to the invention, if the control unit determines that the actual crystal structure does not yet coincide with the crystal structure displayed by the guide even if the rearrangement of atoms is performed, it is determined that the rearrangement of atoms is not appropriately performed since the heating temperature is not proper. Consequently, the control unit makes the heating unit heat the tip of the emitter locally after the heating temperature is raised further than before. Thereby, since the rearrangement of atoms can be performed at the proper temperature, the crystal structure of the tip of the emitter can be reliably returned to the original ideal state.

The focused ion beam apparatus according to the invention is the focused ion beam apparatus of the above invention in which a heating sequence when the heating unit is heated is stored in advance in the storage unit, and the heating unit is heated on the basis of the heating sequence.

In the focused ion beam apparatus according to the invention, when the tip of the emitter is locally heated to perform the rearrangement of atoms, the heating unit is heated on the basis of the heating sequence which is set in advance, optimal heating can be performed according to the kind or the like of the emitter, and the rearrangement of atoms can be performed with high precision.

The focused ion beam apparatus according to the invention is the focused ion beam apparatus of the above invention in which the guide has a structure display mark showing an atomic structure arrayed at the foremost end, in the crystal structure of the tip of the emitter.

In the focused ion beam apparatus according to the invention, if the luminescent spot of the FIM image coincides with the structure display mark when the overlapped FIM image and guide are contrasted with each other, it can be determined that the crystal structure of the tip of the emitter becomes positively pyramidal, and the crystal structure at the foremost end becomes an ideal state. Moreover, it can be clearly distinguished that the luminescent spot is not a contaminant but an atom of the crystal structure.

The focused ion beam apparatus according to the invention is the focused ion beam apparatus of the above invention in which the guide has a plurality of line marks which extends along ridgelines of the crystal structure of the tip of the emitter.

In the focused ion beam apparatus according to the invention, if the luminescent spot of the FIM image substantially coincides with a crossing point between a plurality of line marks when the overlapped FIM image and guide are contrasted with each other, it can be determined that the crystal structure of the tip of the emitter becomes positively pyramidal, and the crystal structure at the foremost end becomes a substantially ideal state. Moreover, it can be clearly distinguished that the luminescent spot is not a contaminant but an atom of the crystal structure.

The focused ion beam apparatus according to the invention is the focused ion beam apparatus of the above invention in which the guide has hierarchical marks showing atoms arrayed at a second stage and the following stages in the crystal structure of the tip of the emitter, and the hierarchical marks are marks which are different from each other at every stage.

In the focused ion beam apparatus according to the invention, the guide has hierarchical marks showing atoms arrayed at a second stage and the following stages in the crystal structures of the tip of the emitter where the guide is formed in a pyramidal shape. The hierarchical marks are marks which are different from each other at every stage, for example, marks which are different in color, form, etc.

Accordingly, in order to confirm the crystal structure of the emitter again when the extraction voltage is gradually raised to perform field evaporation, whether or not the crystal structure can be reliably constructed can be confirmed according to whether or not the luminescent spot and hierarchical marks of the FIM image coincide with each other. Especially, if the heating temperature is not proper when the rearrangement of atoms is performed, the rearrangement of atoms may become imperfect. Meanwhile, as described above, since the guide has the hierarchical marks, the crystal structure of the emitter can be confirmed again by performing field evaporation once, and whether or not the heating temperature is proper can be confirmed. Accordingly, the rearrangement of atoms can be more exactly performed, and this can lead to increases in the quality of the emitter.

The focused ion beam apparatus according to the invention is the focused ion beam apparatus of the above invention in which an extraction voltage where a pattern corresponding to each of the marks begins to appear is stored in the storage unit along with the guide, and the control unit displays each of the marks along with the stored extraction voltage.

In the focused ion beam apparatus according to the invention, the extraction voltage where a pattern corresponding to each mark begins to appear is displayed along with each mark. Thus, the level of the extraction voltage where field evaporation may occur can be grasped. Accordingly, a clearer and high-luminance FIM image can be acquired without causing field evaporation.

According to the focused ion beam apparatus related to the invention, the crystal structure of the emitter can be accurately grasped without being influenced by disturbances, such as contamination, and even if the rearrangement of atoms has been performed, whether or not the crystal structure of the emitter has returned to the original ideal state can also be accurately determined.

DETAILED DESCRIPTION OF THE PREFERRED EMBODIMENTS

Figure 1:
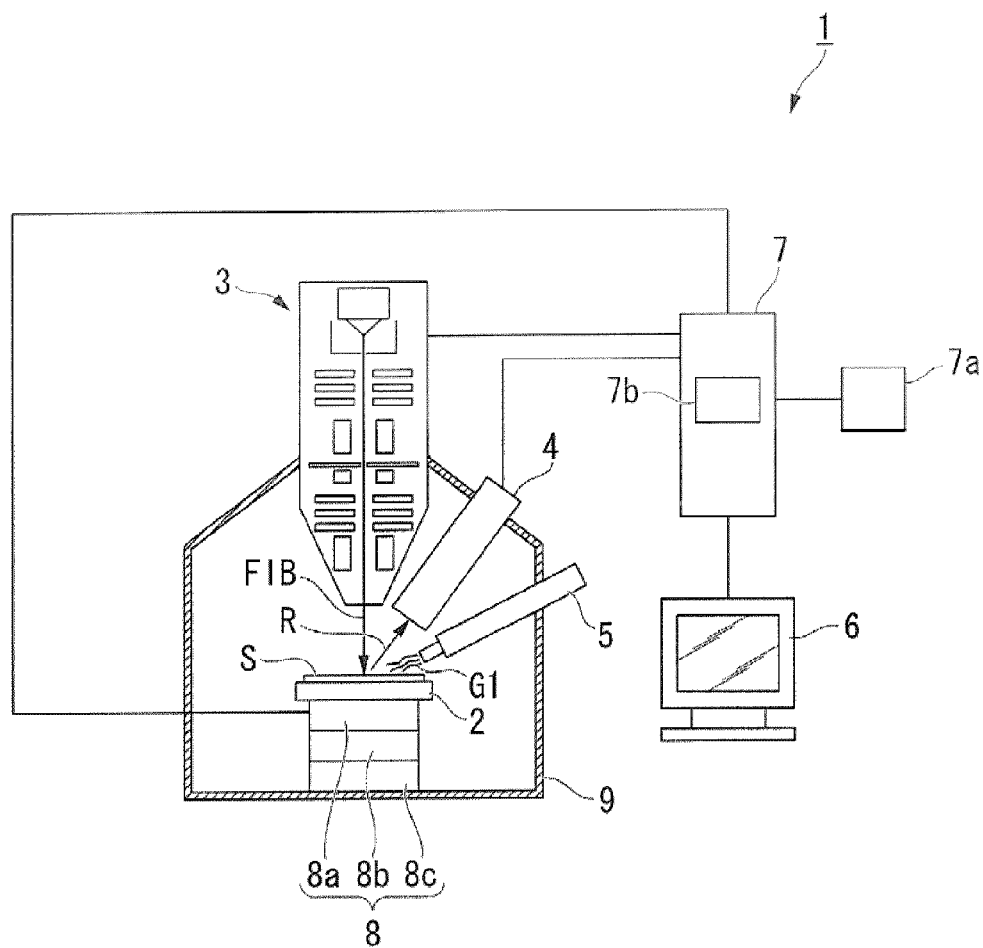
FIG. 1 is an overall configuration diagram showing one embodiment of a focused ion beam apparatus according to the invention.

One embodiment according to the invention will be described below with reference to FIGS. 1 to 29. A focused ion beam apparatus 1 of this embodiment, as shown in FIG. 1, mainly includes a stage 2 on which a sample S is placed, a focused ion beam lens barrel 3 which radiates a focused ion beam (FIB), a detector 4 which detects secondary charged particles R generated by the radiation of the focused ion beam (FIB), a gas gun 5 which supplies a source gas G1 for forming a deposition film, and a control unit 7 which creates image data on the basis of the detected secondary charged particles R and displays the image data on a display unit 6.

The stage 2 is adapted to be actuated on the basis of an instruction of the control unit 7, and is adapted to be capable of being displaced in the directions of five axes. That is, the stage 2 is supported by a displacing mechanism 8 including a horizontal moving mechanism 8a which moves along an X axis and a Y axis which are parallel to a horizontal plane and are orthogonal to each other, and a Z axis orthogonal to the X axis and the Y axis, a tilt mechanism 8b which rotates and tilts the stage 2 around the X axis (or Y axis), and a rotating mechanism 8c which rotates the stage 2 around the Z axis.

Consequently, the stage 2 is displaced in the directions of five axes by the displacing mechanism 8 so that the focused ion beam (FIB) can be radiated towards a desired position. Meanwhile, the stage 2 and the displacing mechanism 8 are housed in a vacuum chamber 9. Therefore, radiation of the focused ion beam (FIB), supply of the source gas G1, etc. are performed within the vacuum chamber 9.

Figure 2:
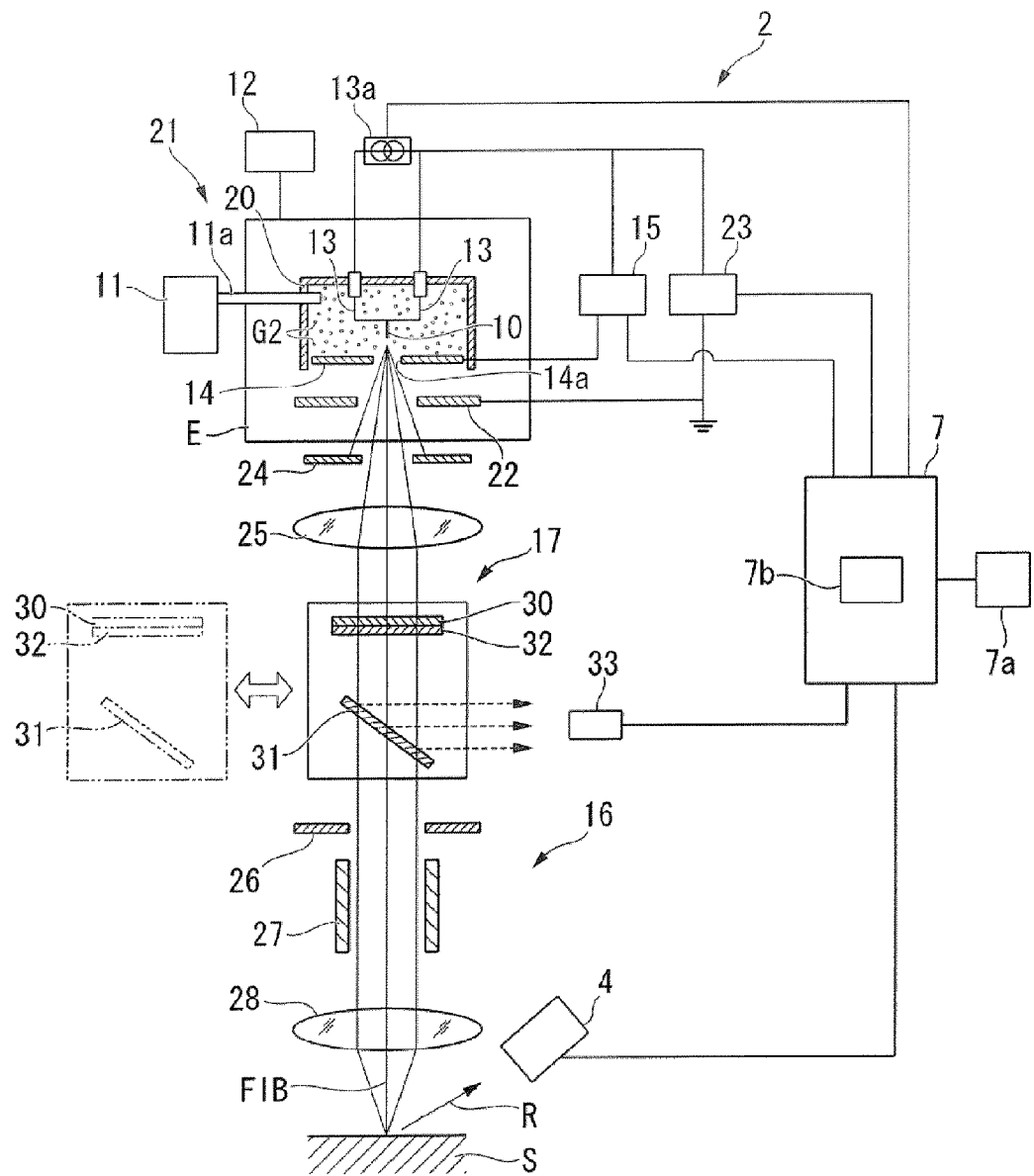
FIG. 2 is a configuration diagram of a focused ion beam lens barrel which constitutes the focused ion beam apparatus shown in FIG. 1.

The focused ion beam lens barrel 3, as shown in FIG. 2, mainly includes an emitter 10, a gas source 11, a cooling unit 12, a heating unit 13, an extraction electrode 14, an extraction power source unit 15, a beam optical system 16, and an image acquiring mechanism 17.

Figure 3:
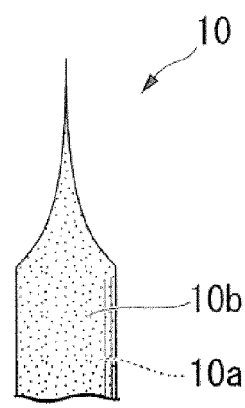
FIG. 3 is an enlarged view of a tip of an emitter shown in FIG. 2.
Figure 4:
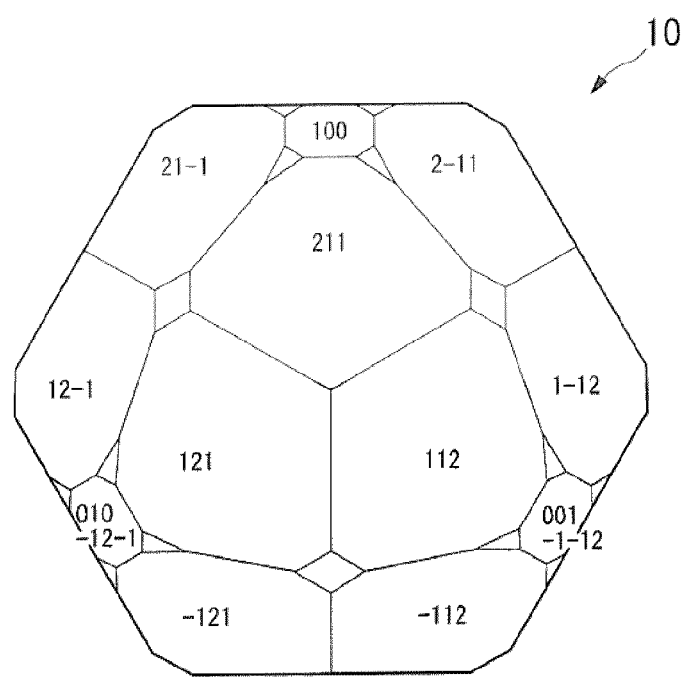
FIG. 4 is a view when the tip of the emitter shown in FIG. 3 is enlarged at the atomic level.

The above emitter 10, as shown in FIG. 3, is a needlelike member the tip of which is sharp-pointed, and is constructed such that a precious metal 10b, such as iridium (Ir), is coated on a base 10a made of, for example, tungsten (W), etc. The tip of the emitter 10 is sharp-pointed at the atomic level, and specifically, as shown in FIG. 4, is constructed such that the crystal structure becomes pyramidal. FIG. 4 is an enlarged view of the tip of the emitter 10 at the atomic level.

The emitter 10 constructed in this way, as shown in FIG. 2, is supported in a state where the emitter is housed within an ion generation chamber 20. The inside of the ion generation chamber 20 is maintained in a high vacuum state. The above gas source 11 supplies a small amount of gas (for example, helium (He) gas) G2 to the periphery of the emitter 10, and communicates with the ion generation chamber 20 via a gas introducing pipe 11a.

The above heating unit 13 is, for example, a filament which heats the tip of the emitter 10 locally. The heating unit 13 serves to heat the tip of the emitter 10 locally to predetermined temperature according to an electric current from an electric current source 13a which operates through an instruction from the control unit 7, and to perform the rearrangement of atoms which constitute the emitter 10.

Figure 5:
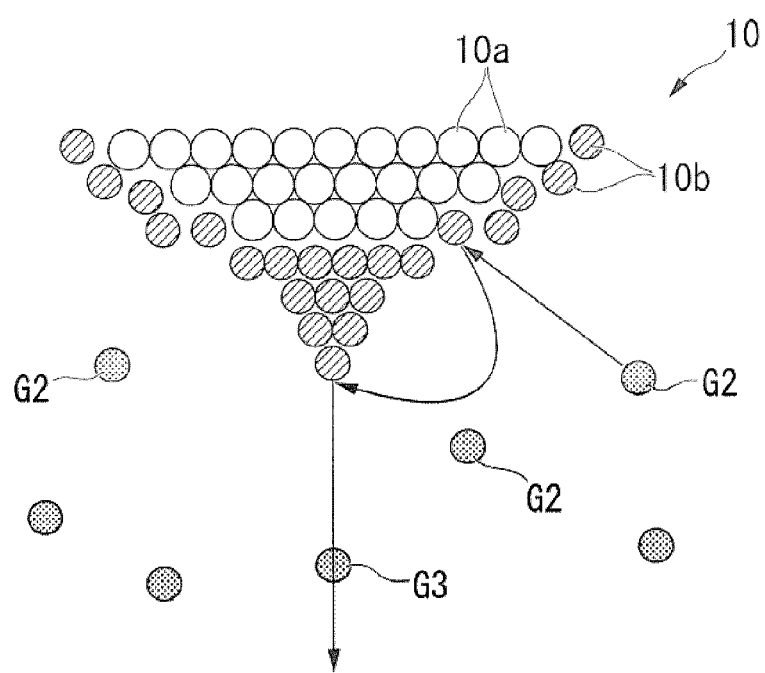
FIG. 5 is a view showing a state where gas ions are generated from the tip of the emitter shown in FIG. 2.

Additionally, the above extraction electrode 14 is disposed at an opening of the ion generation chamber 20 in the state where the extraction electrode is separated from the tip of the emitter 10. An opening 14a is formed at the position of the extraction electrode 14 which faces the tip of the emitter 10. The above extraction power source unit 15 is an electrode which applies an extraction voltage to between the extraction electrode 14 and the emitter 10. The extraction power source unit 15 functions to apply the extraction voltage to ionize the gas G2 into gas ions G3 at the tip of the emitter 10 as shown in FIG. 5, and then extract the gas ions G3 towards the extraction electrode 14.

The above cooling unit 12 cools the emitter 10 with a refrigerant, such as liquid helium or liquid nitrogen. In this embodiment, as shown in FIG. 2, the cooling unit cools a whole space E including the extraction electrode 14. Here, it is desirable that at least the emitter 10 is cooled. Additionally, a refrigerating machine may be used as a cooling method.

Meanwhile, the above-described emitter 10, gas source 11, heating unit 13, extraction electrode 14, extraction power source unit 15, and ion generation chamber 20 constitute a gas field ion source (GFIS) 21 which generates the gas ions G3 from the gas G2.

Additionally, a negative electrode 22 with grounding electric potential is provided below the extraction electrode 14. An acceleration voltage is applied to between the negative electrode 22 and the emitter 10 from an acceleration power source unit 23, and energy is given to the extracted gas ions G3, thereby accelerating the gas ions into an ion beam. A first aperture 24 which narrows down the ion beam is provided below the negative electrode 22. A condenser lens 25 which focuses the ion beam into a focused ion beam (FIB) is provided below the first aperture 24.

A second aperture 26 which is made movable in the X-axis and Y-axis directions and further narrows down the focused ion beam (FIB) is provided below the condenser lens 25. A polariscope 27 which scans the focused ion beam (FIB) on the sample S is provided below the second aperture 26. An objective lens 28 which focuses the focused ion beam (FIB) on the sample S is provided below the polariscope 27.

The above-described negative electrode 22, acceleration power source unit 23, first aperture 24, condenser lens 25, second aperture 26, polariscope 27, and objective lens 28 constitute the above beam optical system 16 which make the extracted gas ions G3 into the focused ion beam (FIB), and then, radiates the ion beam onto the sample S. Additionally, although not shown, an astigmatic corrector and a beam positioning mechanism which are used with a conventional focused ion beam (FIB) are also included in the beam optical system 6.

Additionally, an MCP (microchannel plate) 30 and a mirror 31 are provided between the condenser lens 25 and the second aperture 26, so as to be movable between the position of the focused ion beam (FIB) on the optical axis, and a position apart from the optical axis. At this time, the MCP 30 and the mirror 31 are adapted to move in synchronization with each other on the basis of an instruction from the control unit 7, and are controlled so as to be separated from on the optical axis with the same timing when the sample S is irradiated with the focused ion beam (FIB) and be located on the optical axis when a FIM image (field ion image) of the tip of the emitter 10 is acquired.

In addition, the MCP 30 is adapted such that any gain is automatically adjusted at the acquisition of a FIM image. Additionally, the positions of the MCP 30 and mirror 31 are always recorded, and are set to the same position on the optical axis each time.

A fluorescent screen 32 is provided on the lower surface of the MCP 30, and a FIM image is made to enter the fluorescent screen 32 after being amplified by the MCP. Thereby, the FIM image of the tip of the emitter 10 is projected on the fluorescent screen 32. The projected FIM image is reflected by the mirror 31, is changed in the direction, is guided to a CCD camera 33. This enables a FIM image to be acquired. In addition, the acquired FIM image is sent to the control unit 7.

The above-described MCP 30, mirror 31, fluorescent screen 32, and the CCD camera 33 constitute the image acquiring mechanism 17 which acquires a FIM image of tip of the emitter 10 from the focused ion beam (FIB).

When the focused ion beam (FIB) is radiated, the detector 4 detects the secondary charged particles R, such as secondary electrons, secondary ions and reflected ion which are emitted from the sample S, and scattered ions, and outputs the particles to the control unit 7.

The gas gun 5 supplies a compound gas containing substances (for example, phenanthrene, platinum, carbon, tungsten, etc.) which becomes a raw material of the deposition film as the source gas G1. The source gas G1 is decomposed by the secondary charged particles R generated by the radiation of the focused ion beam (FIB), and is separated into a gas component and a solid component. Then, as the solid component of the two separated components deposits, the solid component becomes the deposition film.

Additionally, substances (for example, xenon fluoride, chlorine, iodine, and water) which accelerate etching selectively can be used in the gas gun 5. For example, xenon fluoride is used if the sample S is Si-based, and water is used if the sample is organic. Additionally, a specific material can be etched by simultaneous radiation with the ion beam.

The control unit 7 is adapted to be able to comprehensively control the above-described respective components, and suitably change an extraction voltage, an acceleration voltage, a beam current, etc. Therefore, the diameter of the focused ion beam (FIB) can be freely adjusted. Thereby, not only an observed image can be acquired, but also the sample S can be locally etched (roughed, finished, etc.).

Additionally, the control unit 7 converts the secondary charged particles R detected by the detector 4 into luminance signals to create observed image data, and then makes the observed image output to the display unit 6 on the basis of the observed image data. This enables an observed image to be confirmed via the display unit 6. Additionally, an input part 7a that can be input by an operator is connected to the control unit 7, and respective components are controlled on the basis of a signal input by the input part 7a. That is, the operator is able to radiate the focused ion beam (FIB) to a desired region via the input part 7a, and observes the focused ion beam, to etch the desired region, or to radiate the focused ion beam (FIB) to deposit the deposition film while supplying the source gas G1 to the desired region.

Additionally, the control unit 7 has a memory (storage unit) 7b which stores a FIM image sent from the CCD camera 33, and is enabled to display the FIM image on the display unit 6. In addition, the above-described observed image data is stored in the memory 7*b*.

Figure 6:
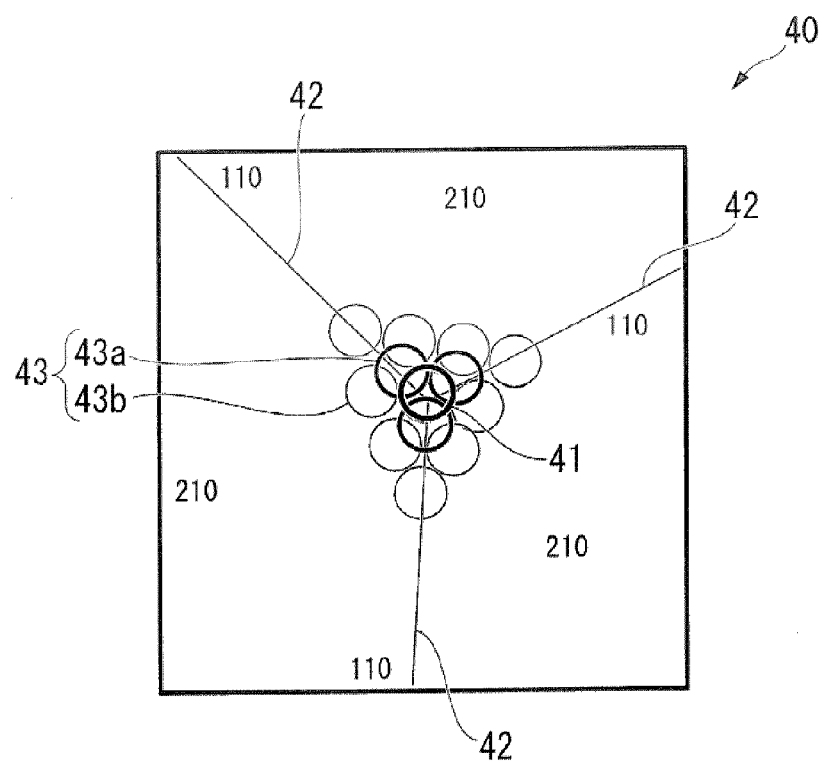
FIG. 6 is a view showing a guide which is stored in a storage unit of a control unit shown in FIG. 1, and displays the ideal crystal structure of the tip of the emitter.
Figure 7:
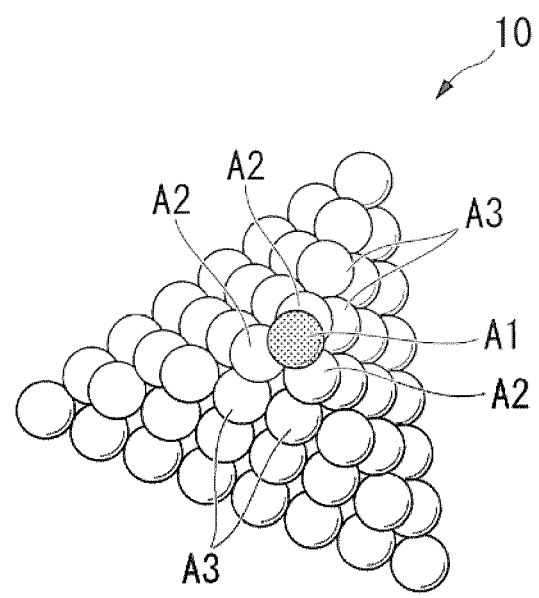
FIG. 7 is a perspective view showing the crystal structure of the tip of the emitter shown in FIG. 3.

Here, a guide 40 shown in the FIG. 6 for displaying the ideal crystal structure of the tip of the emitter 10 is stored in advance in the memory 7*b* of this embodiment. The guide 40, as shown in FIG. 7, has a structure display mark 41 showing an atom A1 arrayed at the foremost end in the ideal pyramidal crystal structures of the tip of the emitter 10, a plurality of (three) line marks 42 which extend along ridgelines of the crystal structure, and an hierarchical mark 43 showing atoms A2 and A3 arrayed at a second stage and the following stages.

In addition, in this embodiment, the emitter 10 which has the crystal structure in which one atom (atom A1) is arrayed at the foremost end will be described as an example.

Figure 8:
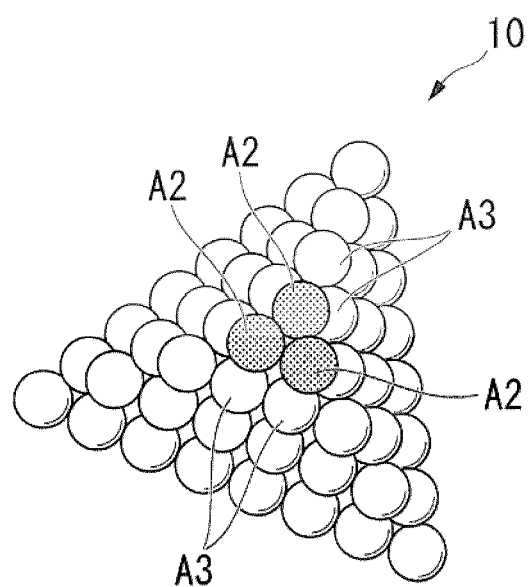
FIG. 8 is a perspective view showing state after an atom arrayed at the foremost end is scattered by field evaporation from the state shown in FIG. 7.
Figure 9:
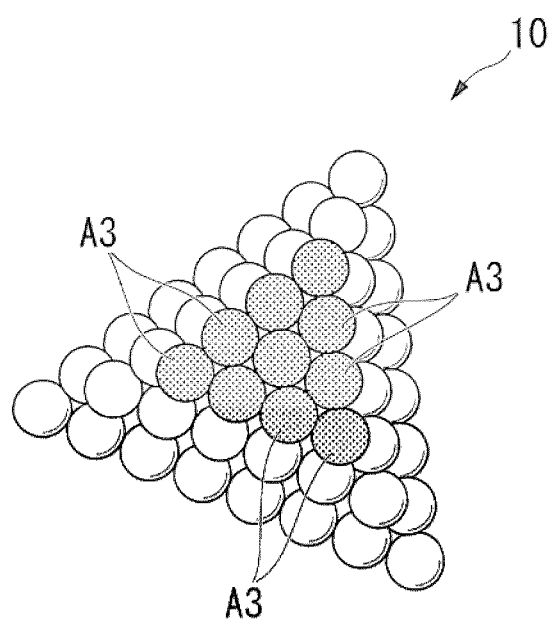
FIG. 9 is a perspective view showing state after three atoms arrayed at a second stage are scattered by field evaporation from the state shown in FIG. 8.

The hierarchical mark 43 of this embodiment, includes a first hierarchical mark 43*a* showing three atoms (hereinafter suitably referred to as a trimer) A2 arrayed at a second stage as shown in FIG. 8, and a second hierarchical mark 43*b* showing atoms A3 arrayed at a third stage as shown in FIG. 9, in the crystal structure of the tip of the emitter 10. At this time, since the first hierarchical mark 43*a* and the second hierarchical mark 43*b* are designed so that colors, forms, and line widths are different in order to show the difference in the number of stages. In this embodiment, as shown in FIG. 6, a case where the line width of the first hierarchical mark 43*a* showing the trimer A2 is displayed more thickly than that of the second hierarchical mark 43*b* is exemplified.

Also, the control unit 7 is adapted to be able to display the above guide 40 in an overlapping manner when the acquired FIM image is displayed on the display unit 6.

Additionally, a heating sequence when the heating unit 13 is heated is stored in advance in the memory. The electric current source 13*a* is adapted to make the heating unit 13 heated on the basis of the heating sequence, thereby locally heating the tip of the emitter 10. For example, the heating is performed on the basis of a heating sequence in which a filament current is raised at constant speed, then the temperature of the filament reaches a target temperature, then the temperature is kept for a predetermined period of time and heated, and then the temperature is made to drop at constant speed.

Next, a case where the focused ion beam apparatus 1 constructed in this way is used will be described below.

In addition, at an initial stage, the crystal structure of the tip of the emitter 10 which is constructed in the shape of an ideal pyramid as shown in FIGS. 4 and 7 will be described.

First, the initial setting when the focused ion beam (FIB) is radiated according to the sample S and a purpose is performed. That is, the extraction voltage, the acceleration voltage, and the gas pressure, temperature, etc. at which the gas G2 is supplied are set to optimal values. Additionally, the position and tilt of the gas field ion source 21, the position of the second aperture 26, etc. are adjusted to perform optical axis adjustment. Additionally, the MCP 30 and the mirror 31 are moved so as to separate from on the optical axis.

After this initial setting is ended, the gas G2 is supplied into the ion generation chamber 20 from the gas source 11, and the emitter 10 is cooled to a predetermined temperature (for example, about 20 K) by the cooling unit 12. After the supply of the gas G2 and the cooling of the emitter 10 are sufficiently performed, the extraction voltage is applied to between the extraction electrode 14 and the emitter 10 by the extraction power source unit 15. Then, since the electric field of the tip of the emitter 10 increases locally, as shown in FIG. 5, at the tip of the emitter 10, the gas G2 within the ion generation chamber 20 is field-ionized, and becomes the gas ions G3. Then, the gas ions G3 are repelled from the emitter 10 maintained at positive potential, and are extracted towards the extraction electrode 14.

The extracted gas ions G3, as shown in FIG. 2, become a focused ion beam (FIB) by the beam optical system 16, and the focused ion beam is radiated towards the sample S. Thereby, observation, etching, etc. of the sample S can be performed. Additionally, when the focused ion beam (FIB) is radiated, it is also possible to supply the source gas G1 from the gas gun 5 to create a deposition film. That is, the secondary electrons generated by the radiation of the focused ion beam (FIB) decompose the source gas G1 to separate the source gas into a gas component and a solid component. Then, only the solid component of the two separated components deposits on the sample S, and becomes a deposition film.

In this way, not only observation or machining but also creation of the deposition film is enabled. Accordingly, the focused ion beam apparatus 1 of this embodiment can be widely used as an apparatus which properly uses these features, thereby performing microscopic observation, length measurement, cross-section observation, cross-section length measurement, TEM sample production, mask repair, drawing, etc.

Especially, since the focused ion beam (FIB) of this embodiment is a beam generated from the gas field ion source 21, the focused ion beam is a high-luminance beam with a small diameter, as compared with a plasma type ion source or a liquid metal ion source. Therefore, when observation is made, a sample can be observed with high resolution, and when processing is made, fine and very high-precision processing can be performed.

Meanwhile, the emitter 10 is sharp-pointed, and the crystal structure is apt to break, molecules, of a contaminant, are apt to adhere to the emitter.

Thus, periodically or as necessary, a FIM image of the tip of the emitter 10 is acquired by the image acquiring mechanism 17, and the crystal structure is confirmed. That is, the MCP 30 and the mirror 31 are moved and located on the optical axis. Then, after the gas ions G3 are converted into electrons and amplified by the MCP 30, the gas ions enter the fluorescent screen 32. Thereby, the FIM image can be projected on the fluorescent screen 32. After the projected FIM image is acquired by the CCD camera 33 via the mirror 31, the image is sent to the control unit 7.

The control unit 7 makes the sent FIM image stored in the memory 7*b* and displayed on the display unit 6. Thereby, the user can observe the displayed FIM image to confirm the actual crystal structure of the tip of the emitter 10. Moreover, the control unit 7 does not display the FIM image simply, but displays the guide 40 stored in advance in the memory 7*b*. Consequently, the user can observe the FIM image while using the guide 40 as an indicator, and can accurately grasp whether or not the actual crystal structure is in an ideal state.

Figure 10:
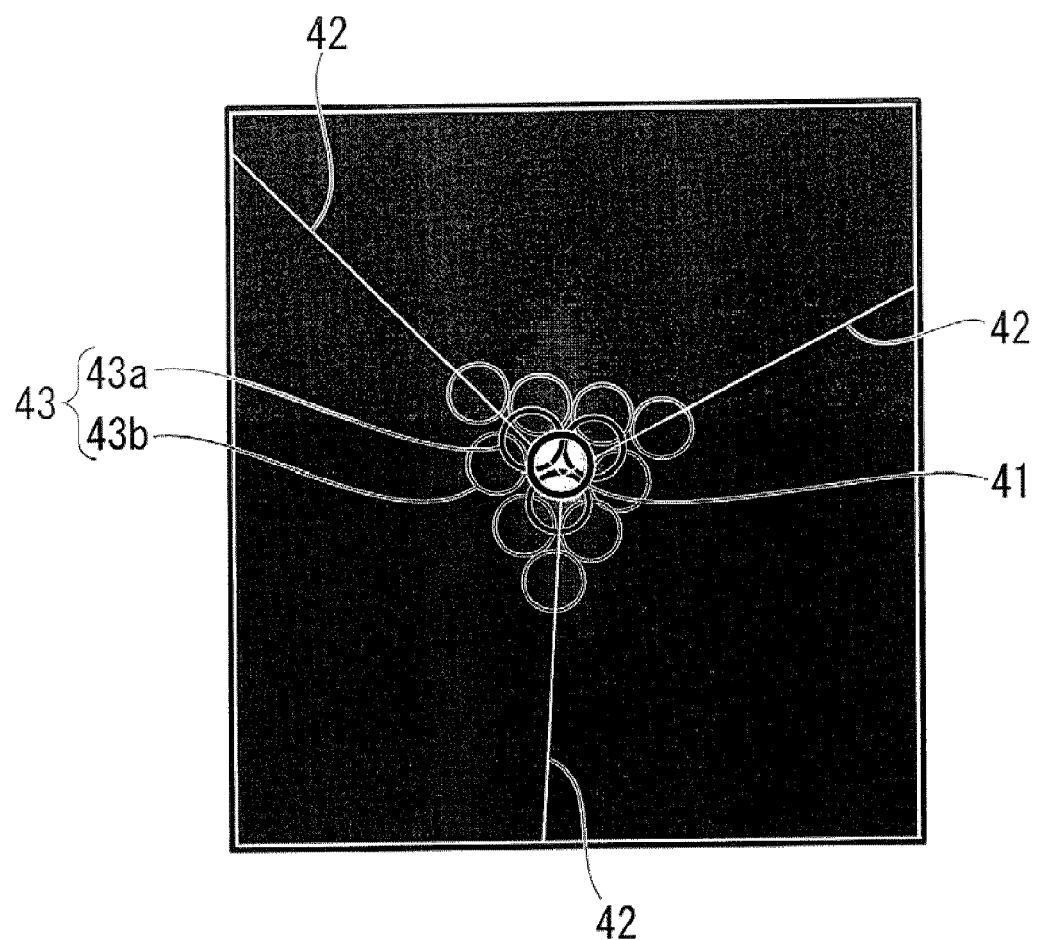
FIG. 10 is a view displaying a FIM image of the tip of the emitter and the guide shown in FIG. 6 in an overlapping manner, and a view showing a state where a centering mark and a luminescent spot coincide with each other.

For example, as shown in FIG. 10, if the luminescent spot of the FIM image coincides with the structure display mark 41 when the overlapped FIM image and guide 40 are contrasted with each other, it can be determined that the crystal structure of the tip of the emitter 10 becomes positively pyramidal, and the atom A1 exists on the foremost end. Moreover, it can be clearly distinguished that the luminescent spot is not a contaminant but an atom of the crystal structure. As a result, it can be determined that the crystal structure of the tip of the emitter 10, as shown in FIG. 7, remains ideal pyramidal.

If a contaminant has adhered to the surface of the emitter 10, a luminescent spot resulting from the adhesion of the contaminant appears on the FIM image. Even in this case, since the guide 40 is used as an indicator, it can be accurately distinguished that the luminescent spot is influenced not by an atom but by a contaminant.

In this way, according to this embodiment, the crystal structure of the emitter 10 can be accurately grasped without being influenced by disturbances, such as contamination.

Figure 11:
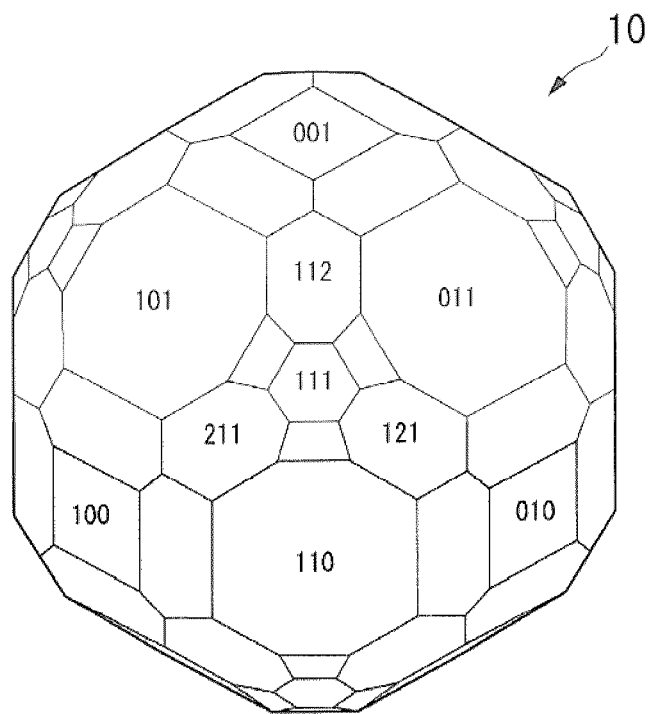
FIG. 11 is a view showing an example where the crystal structure of the tip of the emitter shown in FIG. 3 has been changed.
Figure 12:
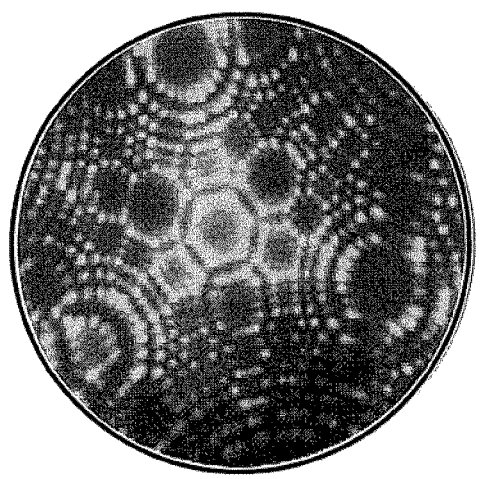
FIG. 12 shows a FIM image of the tip of the emitter in the case of the crystal structure shown in FIG. 11.

Meanwhile, when the crystal structure of the emitter 10 has been broken in use, the rearrangement of atoms which constitute the emitter 10 is performed. In addition, whether or not the crystal structure has been broken can be determined by observing the FIM image. For example, when the crystal structure of the tip of the emitter 10 is brought into a state as shown in FIG. 11, a FIM image shown in FIG. 12 is acquired. Consequently, it can be determined that the crystal structure has clearly been changed.

As such, when the crystal structure has been broken, the heating unit 13 is operated to heat the tip of the emitter 10 locally (for example, for several minutes at 800° C. to 900° C.). At this time, heating is made on the basis of the heating sequence stored in the memory 7b. Then, the atoms which constitute the emitter 10 are rearranged, and the crystal structure of the tip of the emitter 10 can be returned to the original pyramid structure shown in FIG. 4.

Especially, since heating is made on the basis of the present heating sequence, optimal heating can be performed according to the kind or the like of the emitter 10, and the rearrangement of the atoms can be performed with high precision.

Then, after the rearrangement of atoms is performed, a FIM image is acquired again and is contrasted with the guide 40. Thereby, whether or not the crystal structure after the rearrangement has returned to the original ideal state can be accurately determined.

As described above, according to the focused ion beam apparatus 1 of this embodiment, the guide 40 is utilized, the crystal structure of the emitter 10 can be accurately grasped without being influenced by disturbances, such as contamination. In addition, even if the rearrangement of atoms has been performed, whether or not the crystal structure of the emitter 10 has returned to the original ideal state can also be accurately determined. Accordingly, the gas ions G3 can always be stably generated, and a high-luminance focused ion beam (FIB) with a small beam diameter can be kept being radiated.

Meanwhile, in this embodiment, the guide 40 has the line marks 42 and the hierarchical mark 43. Thus, it can be confirmed whether or not the crystal structure of the emitter 10 is completely rearranged while the extraction voltage is gradually raised to perform field evaporation, after the rearrangement of atoms is performed.

Figure 13:
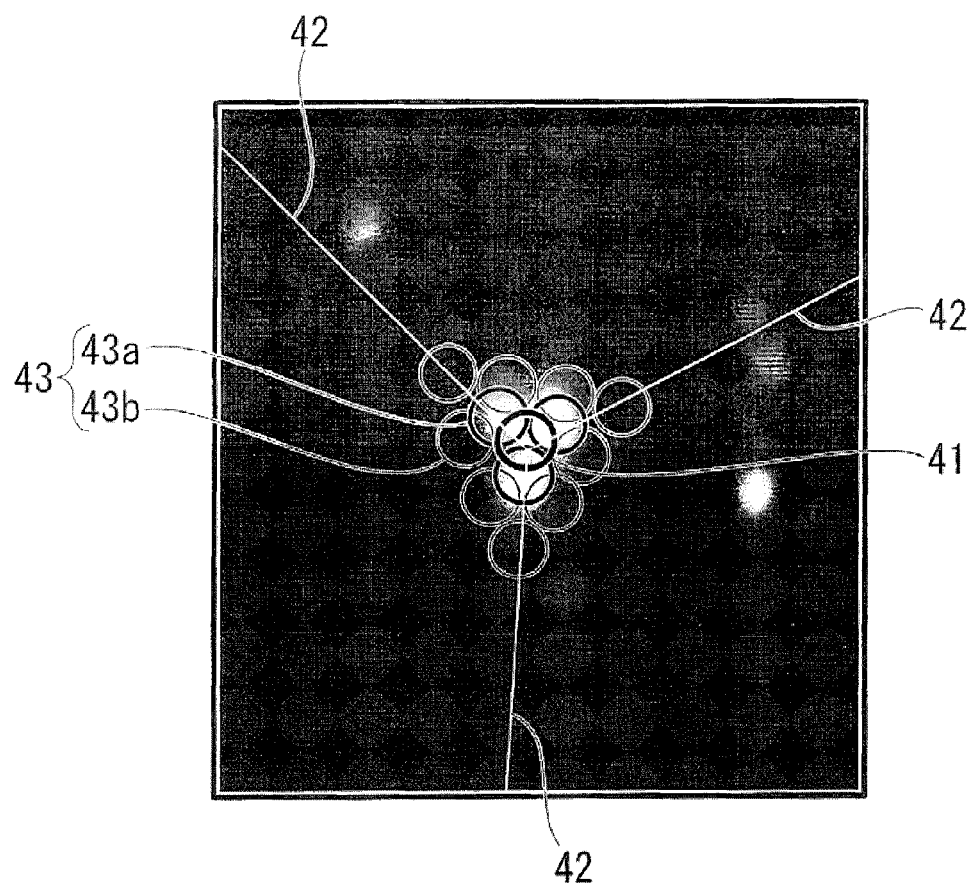
FIG. 13 is a view displaying a FIM image of the tip of the emitter and the guide shown in FIG. 6 in an overlapping manner, and a view showing a state where a hierarchical mark and a luminescent spot coincide with each other.

That is, if the extraction voltage is raised from the state shown in FIG. 10, the atom A1 arrayed at the foremost end in the crystal structures of the tip of the emitter 10 is scattered by field evaporation. If the extraction voltage is further raised from this state, since the electric field of the trimer A2 arrayed at the second stage increases as shown in FIG. 13, three luminescent spots appear on the FIM image. At this time, the trimer A2 can also be determined to be ideally rearranged as the three luminescent spots coincide with the first hierarchical mark 43a. At this time, as shown in FIG. 14, when the three luminescent spots have deviated from the first hierarchical mark 43a, it can be determined that the position (rotation) of the trimer A2 has been rearranged in an imperfect state.

Especially, if the heating temperature is not proper when the rearrangement of atoms is performed, the rearrangement of atoms may become imperfect. Meanwhile, since the guide 40 of this embodiment has the hierarchical mark 43 and the line marks 42, the crystal structure of the emitter 10 can be confirmed again by performing field evaporation once, and whether or not the heating temperature is proper can be confirmed. Accordingly, the rearrangement of atoms can be more exactly performed, and this can lead to the high quality of the emitter 10.

Figure 14:
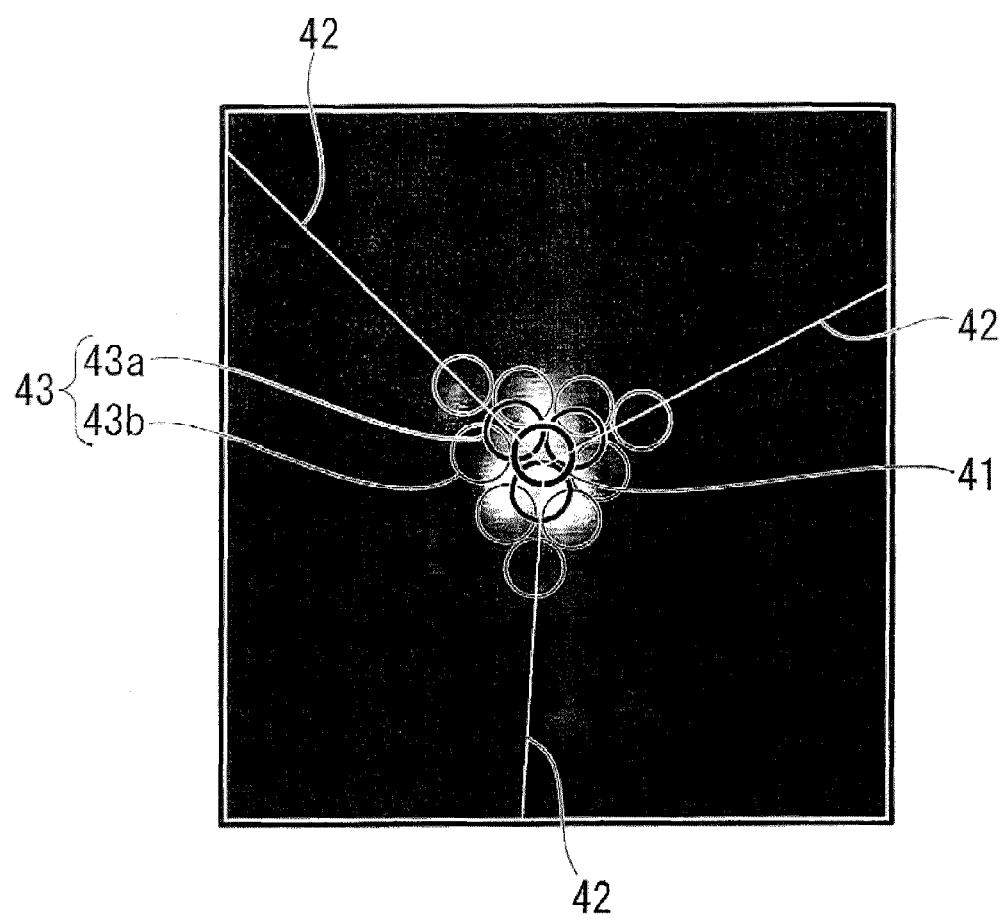
FIG. 14 is a view displaying a FIM image of the tip of the emitter and the guide shown in FIG. 6 in an overlapping manner, and a view showing a state where a hierarchical mark and a luminescent spot deviate from each other.

In addition, by further raising the extraction voltage from the state shown in FIG. 14, the trimer can be scattered by field evaporation, and the arrangement of the atoms A3 at a third stage and the following stages, and the ridgelines of the crystal structure can be expressed as luminescent spots on the FIM. At this time, by comparing the luminescent spots with the second hierarchical mark 43b or the line marks 42, whether or not the crystal structure has been completely rearranged can also be confirmed in more detail.

Next, a method of preparing the guide 40 used in the above embodiment will be described.

This method is a method of gradually raising the extraction voltage to perform field evaporation, and setting and preparing each mark while observing a change during this period, while acquiring a FIM image of the emitter 10 of which the crystal structure of the tip is formed into the ideal pyramidal shape as shown in FIG. 7.

First, the change of the FIM image while the extraction voltage is gradually raised to perform field evaporation will be described.

Figure 15:
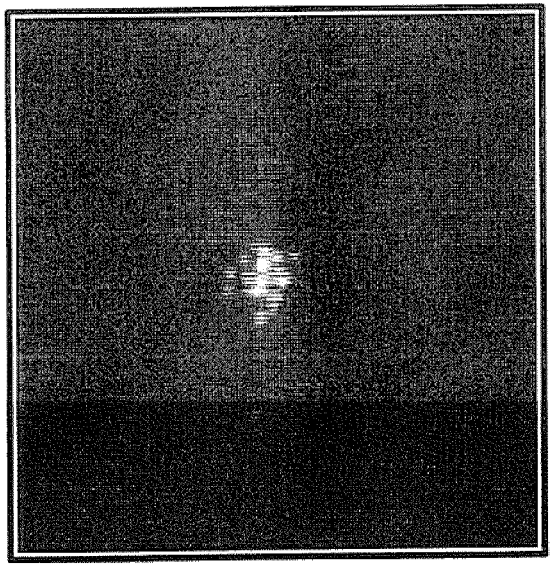
FIG. 15 is a view showing a FIM image of the tip of the emitter having the crystal structure shown in FIG. 7, and a view showing a state where a luminescent spot showing an atom arrayed at the foremost end begins to appear.
Figure 16:
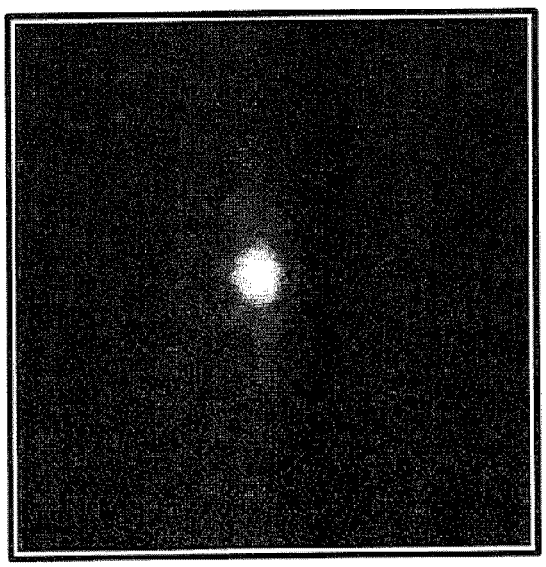
FIG. 16 is a view showing a state where the luminescent spot showing the atom arrayed at the foremost tip has more clearly appeared by further raising the extraction voltage after the state shown in FIG. 15.
Figure 17:
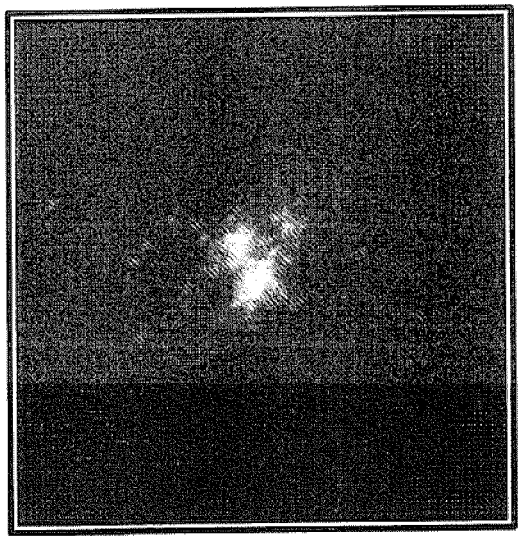
FIG. 17 is a view showing a state where three luminescent spots showing a trimer arrayed at a second stage begin to appear after the previous luminescent spot has disappeared along with field evaporation of the luminescent spot showing the atom arrayed at the foremost tip, by further raising the extraction voltage after the state shown in FIG. 16.
Figure 18:
FIG. 18 is a view showing a state where the three luminescent spots showing the trimer arrayed at the second stage have more clearly appeared by further raising the extraction voltage after the state shown in FIG. 17.

If the raised extraction voltage becomes about 4.3 kV, the electric field of the atom A1 at the foremost end increases gradually as shown in FIG. 15. Thus, the luminescent spot showing the atom A1 at the foremost end begins to appear on the FIM image. If the extraction voltage rises and becomes about 4.5 kV, the electric field of the atom A1 at the foremost end becomes higher as shown in FIG. 16, and the luminescent spot showing the atom A1 at the foremost end appears clearly on the FIM image. Meanwhile, if the extraction voltage further rises, as shown in FIG. 17, the atom A1 at the foremost end may be scattered by field evaporation, and the previous luminescent spot disappears, and three luminescent spots showing the trimer A2 arrayed at a second stage begin to appear on the FIM image. Then, if the extraction voltage further rises and becomes about 4.6 to 4.8 kV, the electric field of the trimer A2 becomes higher as shown in FIG. 18, and the three luminescent spots showing the trimer A2 appear clearly on the FIM image.

Figure 19:
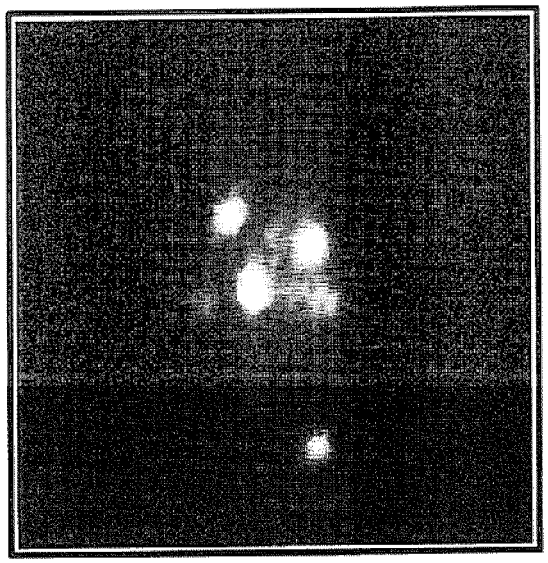
FIG. 19 is a view showing a state where a plurality of luminescent spots showing atoms arrayed at a third stage and the following stages begin to appear after the previous three luminescent spots have disappeared along with field evaporation of the trimer, by further raising the extraction voltage after the state shown in FIG. 18.
Figure 20:
FIG. 20 is a view showing a state where the plurality of luminescent spots showing the atoms arrayed at the third stage and the following stages have more clearly appeared by further raising the extraction voltage after the state shown in FIG. 19.
Figure 21:
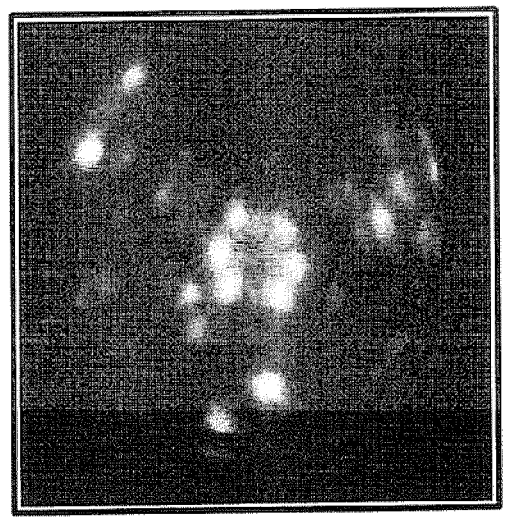
FIG. 21 is a view showing a state where a plurality of luminescent spots have appeared along ridgelines of the crystal structure by further raising the extraction voltage after the state shown in FIG. 20.

Meanwhile, if the extraction voltage further rises, the trimer A2 is also scattered, and the previous three luminescent spots disappear, and if the extraction voltage becomes about 5.0 to 6.0 kV, as shown in FIG. 19, a plurality of luminescent spots showing the atoms A3 arrayed at a third stage and the following stages begin to appear on the FIM image. Then, if the extraction voltage is further raised and begins to exceed 6.0 kV, as shown in FIG. 20, the electric field of the atoms A3 arrayed at the third stage and the following stages further increase, and the number of luminescent spots begins to increase. Due to the further rise in the extraction voltage, as shown in FIG. 21, luminescent spots begin to appear at the ridgelines of the crystal structure.

By gradually raising the extraction voltage to perform field evaporation in this way, the change of the crystal structure of the tip of the emitter 10 can be gradually confirmed by the FIM image.

Figure 22:
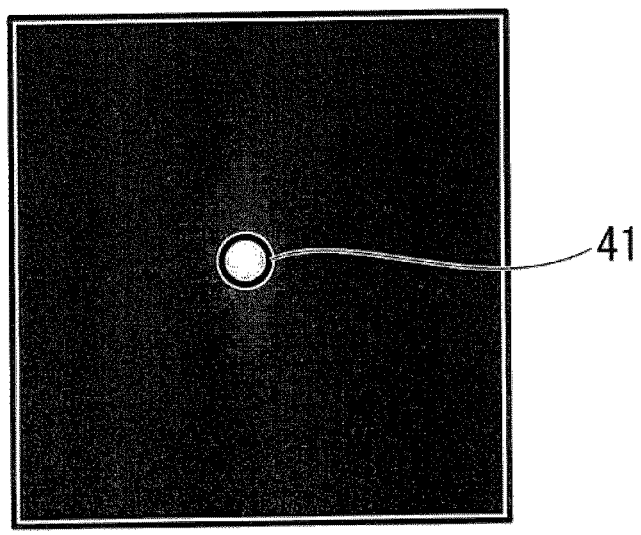
FIG. 22 is a view showing one process when the guide shown in FIG. 6 is prepared, and a view showing a state where the centering mark is set when the luminescent spot showing the atom arrayed at the foremost end has appeared in the FIM image.
Figure 23:
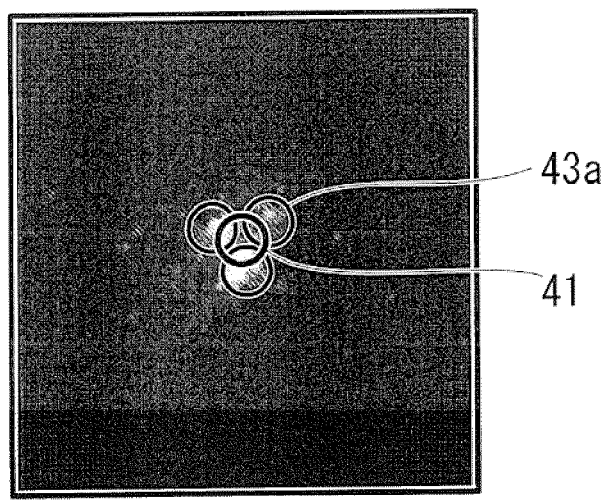
FIG. 23 is a view showing one process when the guide shown in FIG. 6 is prepared, and a view showing a state where a first hierarchical mark is set when the three luminescent spots showing the trimer have appeared in the FIM image.
Figure 24:
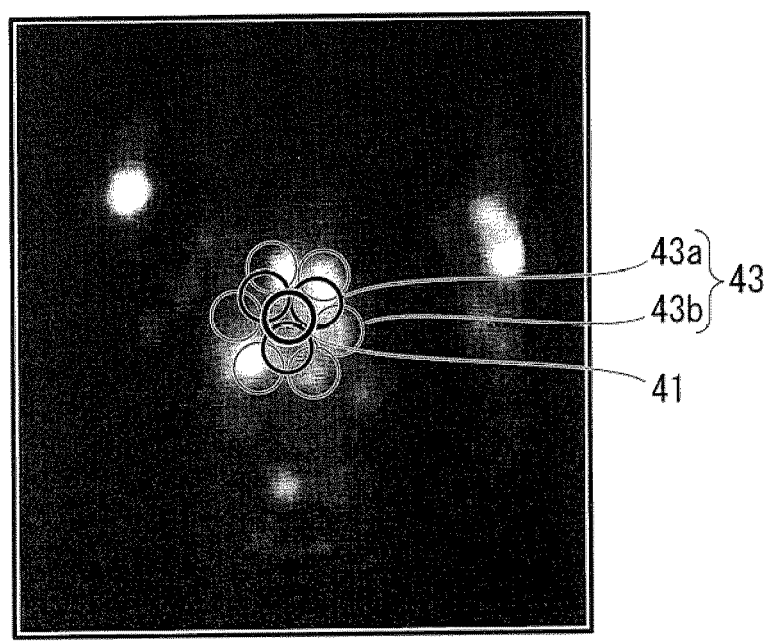
FIG. 24 is a view showing one process when the guide shown in FIG. 6 is prepared, and a view showing a state where a second hierarchical mark is set when the plurality of luminescent spots showing the atoms at the third stage and the following stages have appeared in the FIM image.
Figure 25:
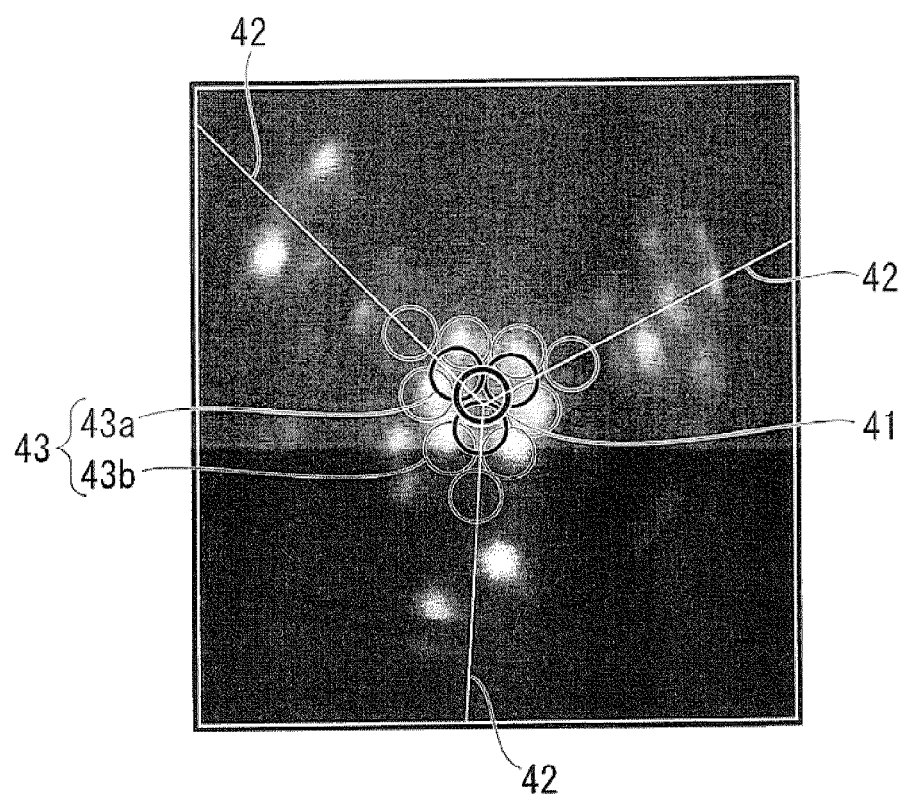
FIG. 25 is a view showing one process when the guide shown in FIG. 6 is prepared, and a view showing a state where a line mark is set when a plurality of luminescent spots has appeared along the ridgelines of the crystal structure in the FIM image.

Then, as shown in FIG. 22, the structure display mark 41 is set when the luminescent spot showing the atom A1 at the foremost end appears clearly on the FIM image. Subsequently, as shown in FIG. 23, the first hierarchical mark 43a is set when the three luminescent spots showing the trimer A2 appear clearly on the FIM image. Subsequently, as shown in FIG. 24, the second hierarchical mark 43b is set when a plurality of luminescent spots showing the atoms A3 at the third stage appear clearly on the FIM image. Finally, as shown in FIG. 25, the line marks 42 are set when a plurality of luminescent spots showing the ridgelines of the crystal structure appear clearly on the FIM image.

This enables the guide 40 shown in FIG. 6 to be completed. In addition, on the screen of the display unit 6, the movement, rotation, centre position change, and scale change of the guide 40 are made free, and the display and non-display switching of the guide are also enabled. Consequently, it is natural that the user is also enabled to observe the FIM image without the guide 40.

Additionally, when each mark is set, the extraction voltage when a luminescent spot corresponding to each mark appears may be stored in the memory 7b, and may be displayed in accordance with the guide 40.

By adopting his configuration, when the guide 40 is displayed, the extraction voltage where a pattern corresponding to each mark begins to appear is displayed along with each mark. Thus, the level of the extraction voltage where field evaporation may occur can be grasped. Accordingly, a clearer and high-precision FIM image can be acquired without causing field evaporation.

In addition, the method of preparing the guide 40 described above may be performed in advance on the manufacturer side, and may make the prepared guide 40 stored in the memory 7b, or may be performed on the user side when the emitter 10 becomes available, and may make the prepared guide 40 stored in the memory 7b.

Additionally, in the above embodiment, the control unit 7 may be configured so as to automatically determine the crystal structure of the tip of the emitter 10.

In this case, it is desirable that the control unit 7 may be configured so as to automatically determine whether or not the actual crystal structure of the tip of the emitter 10 read from the FIM image coincides with the crystal structure displayed by the guide 40 after the acquired FIM image and the guide 40 are displayed in an overlapping manner. By adopting this configuration, the user can accurately grasp the crystal structure of the emitter 10 without performing a special operation. Accordingly, use becomes easier and convenience can be improved.

Especially, as described above, when the extraction voltage corresponding to the structure display mark 41 is displayed on the guide 40, it is also possible for the user to raise the current extraction voltage by reference to a current extraction voltage and a displayed extraction voltage and to confirm the crystal structure.

Additionally, if non-coincidence is determined, the control unit 7 may be configured so as to control the extraction power source unit 15 so that the extraction voltage changes with a predetermined amplitude.

In this case, if the control unit 7 determines that the actual crystal structure of the tip of the emitter 10 does not coincide with the crystal structure displayed by the guide 40, the extraction power source unit 15 is controlled to change the extraction voltage between the emitter 10 and the extraction electrode 14 with a predetermined amplitude. Then, an electric field increases locally at a convex part on the surface of the emitter 10, and field evaporation is apt to occur. Consequently, when a contaminant has adhered to the surface of the emitter 10, the binding power of the contamination is weaker than that of the crystal structure. Therefore, it is possible to scatter this contamination preferentially by field evaporation. Accordingly, it is possible to provide a high-quality emitter 10 to which a contaminant does not adhere.

Furthermore, if non-coincidence is determined after the extraction voltage has been changed, the control unit 7 may be configured so that the heating unit 13 may be operated to perform the rearrangement of atoms of the emitter 10 again. In this case, if the control unit 7 determines that the actual crystal structure of the tip of the emitter 10 does not yet coincide with the crystal structure displayed by the guide 40 even if the change in the extraction electrode is performed, it is determined that the crystal structure is imperfect and has not returned to the original ideal state. Consequently, the control unit 7 makes the heating unit 13 heat the tip of the emitter 10 locally, thereby perform the rearrangement of atoms again. Thereby, the crystal structure of the tip of the emitter 10 can be returned to the original ideal state.

Furthermore, if non-coincidence is still determined even if the heating unit 13 is operated, the control unit 7 may be configured so as to perform the rearrangement of atoms of the emitter 10 again in a state where the heating temperature of the heating unit 13 is further raised than before.

In this case, if the control unit 7 determines that the actual crystal structure does not yet coincide with the crystal structure displayed by the guide 40 even if the rearrangement of atoms is performed, it is determined that the rearrangement of atoms is not appropriately performed since the heating temperature is not proper. Consequently, the control unit 7 makes the heating unit 13 heat the tip of the emitter 10 locally after the heating temperature is further raised than before. Thereby, the crystal structure of the tip of the emitter 10 can be reliably returned to the original ideal state.

In addition, the technical scope of the invention is not limited to the above embodiment, but various modifications may be made without departing from the spirit and scope of the invention.

For example, in the above embodiment, the guide 40 which has the structure display mark 41, the hierarchical mark 43, and the line marks 42 has been described as an example. However, a guide 40 which has only the structure display mark 41 and the line marks 42 may be adopted. In addition to this, a guide 40 which has marks showing the atomic structure [BCC (body-centered cubic) and FCC (face-centered cubic)] or marks showing a lattice plane and orientation may be adopted.

Figure 26:
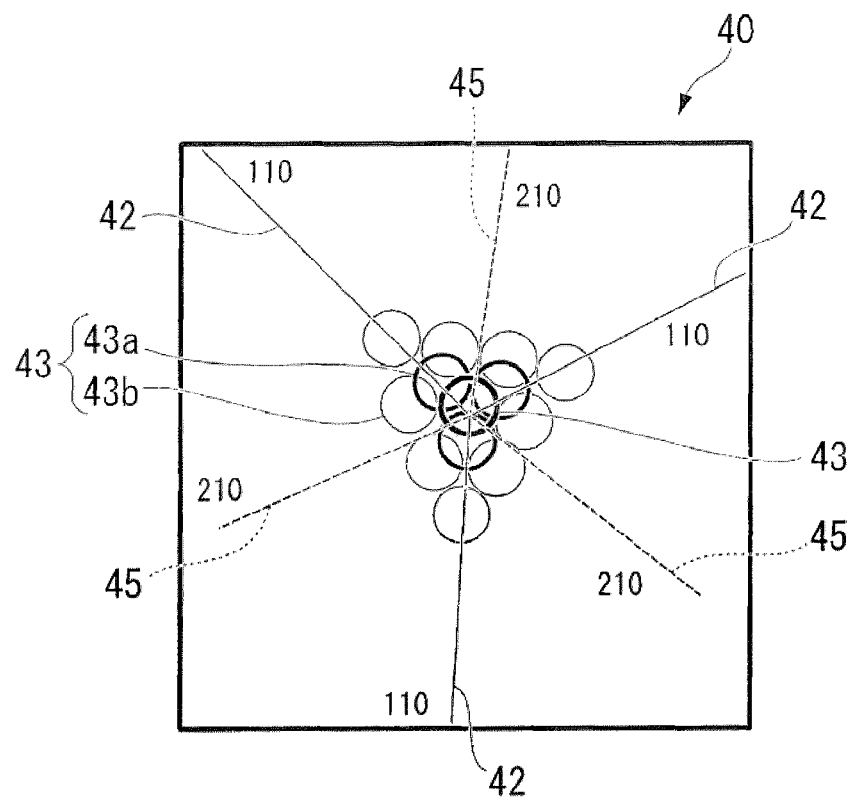
FIG. 26 is a view showing a modification of the guide shown in FIG. 6.
Figure 27:
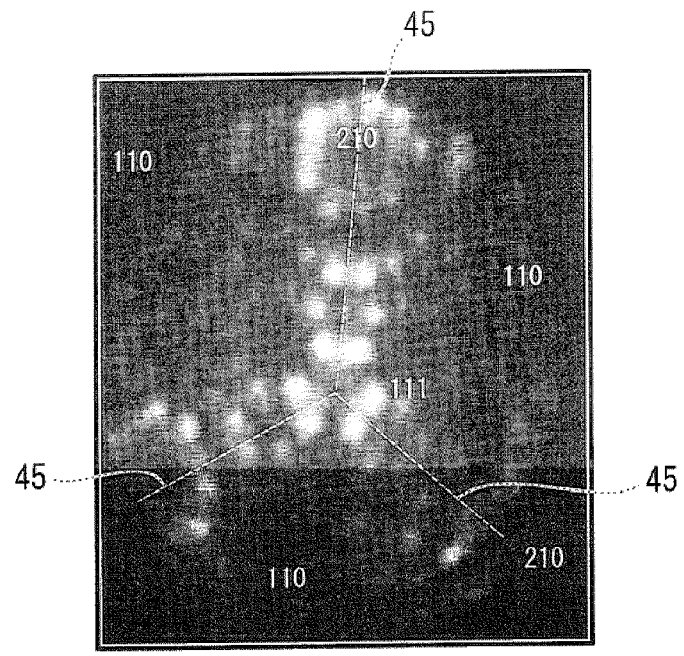
FIG. 27 is a view showing one process when line marks of the guide shown in FIG. 26 is set, and a view showing a state where the line marks have been set along the ridgelines before a facet.

Additionally, although the guide 40 which has the three line marks 42 has been described, as shown in FIG. 26, a guide 40 which has six line marks 42 and 45 may be adopted. Among these line marks, three added line marks 45 are marks showing ridgelines set before a facet, as shown in FIG. 27.

That is, if the crystal orientation of the emitter 10 is a (111) plane like the above embodiment, the line marks may be symmetrical 3 times or 6 times.

Figure 28:
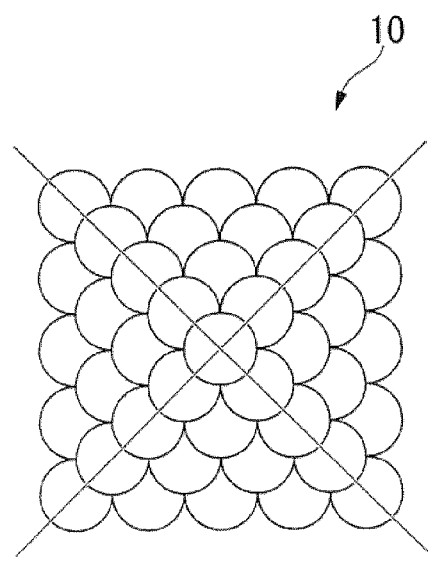
FIG. 28 is a view showing a modification of the crystal structure of the tip of the emitter.

Additionally, in the above embodiment, the crystal orientation of the emitter 10 is the (111) plane. However, as shown in FIG. 28, the crystal orientation may be a (100) plane or a (110) plane. In addition, if the crystal orientation of the emitter 10 is the (100) plane, it is desirable that the line marks are symmetrical 4 times and 8 times, and if the crystal orientation is the plane (110), it is desirable that the line marks are symmetrical 2 times and 4 times.

Additionally, in the above embodiment, the tungsten (W) is used as the base material 10a of the emitter 10. However, molybdenum (Mo) may be used. Additionally, iridium (Ir) is used as the precious metal 10b which coats the surface of the base material 10a. However, palladium (Pd), rhodium (Rh), rhenium (Re), osmium (Os), etc. may be used. Especially, since the surface of the emitter 10 is coated with such various kinds of precious metals 10b, the emitter has chemical resistance. In addition, it is preferable to use iridium (Ir) in terms of chemical resistance.

Additionally, in the above embodiment, the emitter 10 which has the crystal structure in which one atom (the atom A1) is arrayed at the foremost end has been described as an example. However, the invention is not necessarily limited to the case where termination is made at one atom. As long as the same crystal structure is reproduced by regeneration processing (rearrangement of atoms), the crystal structure where three atoms, etc. are arrayed at the foremost end may be adopted. In addition, the crystal structure differs in the material or regeneration processing of crystal.

In addition, if the crystal structure arrayed at the foremost end has three atoms, in accordance with this, it is desirable that the structure display mark 41 of the guide 40 is also a mark which displays three atoms.

Additionally, in the above embodiment, helium (He) gas is supplied as the gas G2 to be supplied into the ion generation chamber 20. However, the invention is not limited to this case. For example, argon (Ar) gas, neon (Ne) gas, krypton (Kr) gas, xenon (Xe) gas, etc. may be used. Furthermore, gases other than rare gases, such as hydrogen ($H_2$) and oxygen ($O_2$), can also be used. At this time, according to applications of the focused ion beam (FIB), the kind of the gas G2 may be changed on the way, or two or more kinds of the gas G2 may be mixed, and supplied.

Additionally, in the above embodiment, when atoms which constitute the emitter 10 are rearranged, the tip of the emitter 10 is heated locally. In this case, the invention is not limited to heating the emitter simply, and the atoms may be rearranged by emitting electrons in a strong electric field in addition to the heating. Furthermore, in addition to the heating, the atoms may be rearranged by emitting electrons while introducing helium (He) gas, neon (Ne) gas, or argon (Ar) gas in a strong electric field. Furthermore, in addition to the heating, the atoms may be rearranged while introducing oxygen ($O_2$) and nitrogen ($N_2$). Even in these cases, the same operational effects can be exhibited.

Additionally, in the above embodiment, the image acquiring mechanism 17 is constituted by the MCP 30, the mirror 31, the fluorescent screen 32, and the CCD camera 33. However, the image acquiring mechanism may be constituted in any way as long as a FIM image can be acquired.

Figure 29:
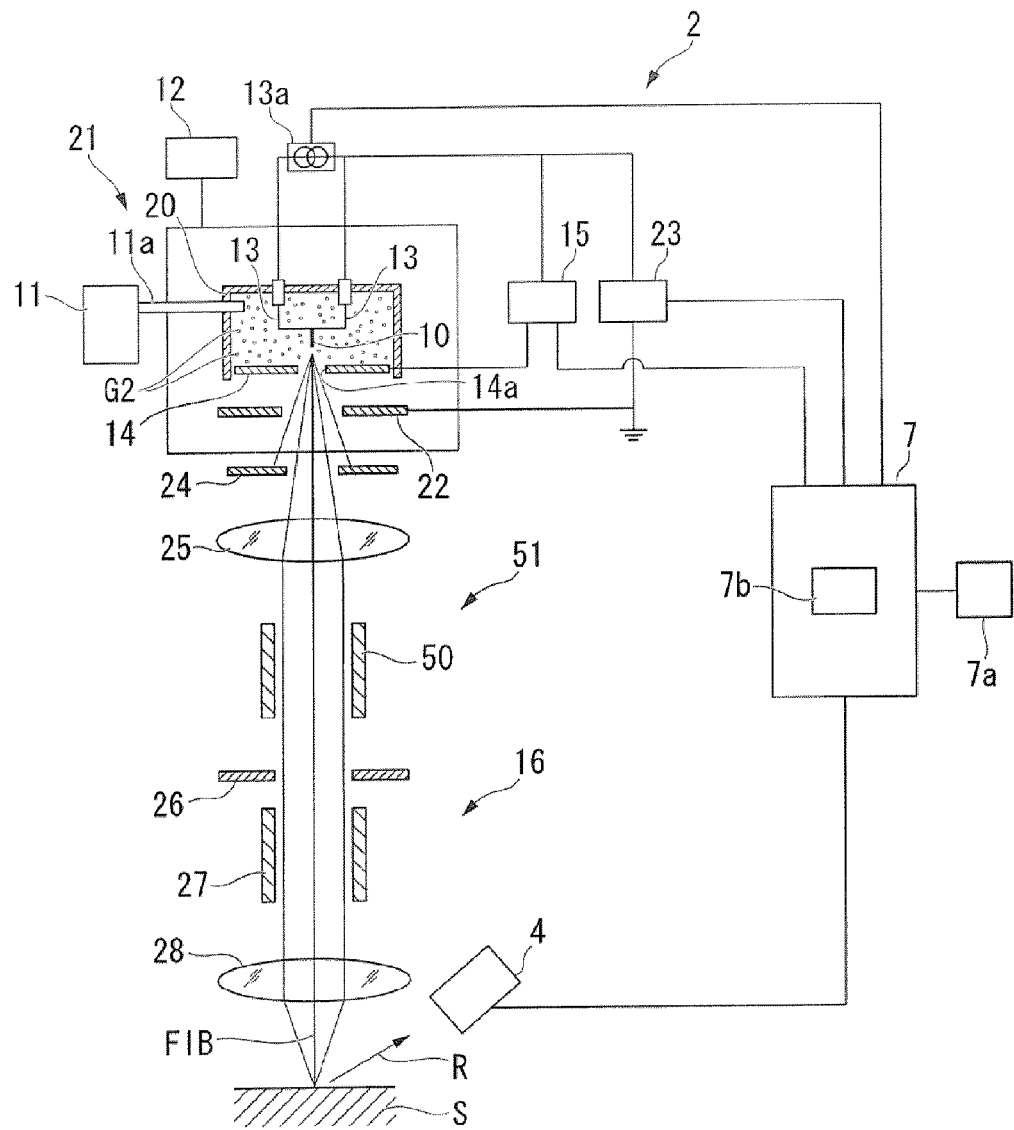
FIG. 29 is a view showing a modification of an image acquiring mechanism shown in FIG. 2.

For example, as shown in FIG. 29, an aligner 50 which adjusts the optical axis of the focused ion beam (FIB) may be provided between the condenser lens 25 and the second aperture 26, and a FIM image may be acquired using the aligner 50.

That is, scanning with the focused ion beam (FIB) can be made on the second aperture 26 which has a certain distribution by utilizing the aligner 50. Then, only the pattern of the focused ion beam (FIB) which has passed through the second aperture 26 along with the scanning hits the sample S to generate the secondary charged particles R. Also, the secondary charged particles R at this time are detected by the detector 4. Also, a scan signal at the scanning added to the aligner 50 and a detection signal when the secondary charged particles R are detected by the detector 4 are synchronized with each other to form an image, so that an image equivalent to a FIM image can be observed. Accordingly, even in this case, the same operational effects can be exhibited. In addition, in this case, the aligner 50 and the detector 4 function as the image acquiring mechanism 51.

In addition, when this configuration is adopted, an image may be formed on the second aperture 26 by using the condenser lens 25.

What is claimed is:

1. A focused ion beam apparatus comprising:
   an emitter having a sharp-pointed tip, and having a pyramidal crystal structure at the tip;
   a gas source which supplies gas to the periphery of the emitter;
   a cooling unit which cools the emitter;
   a heating unit which locally heats the tip of the emitter to perform a rearrangement of atoms that constitute the emitter;
   an extraction electrode disposed apart from the tip of the emitter;
   an extraction power source unit that applies an extraction voltage between the emitter and the extraction electrode to ionize the gas into gas ions at the tip of the emitter, and then extract the gas ions towards the extraction electrode;
   a beam optical system that forms the extracted gas ions into a focused ion beam, and then radiates the focused ion beam onto a sample;
   an on-board image acquiring mechanism having optical components positionable in the ion beam that acquire an FIM image of the tip of the emitter from the focused ion beam; and
   a control unit having a display unit which displays the acquired FIM image, and having a storage unit which stores the FIM image,
   wherein a guide image which includes an ideal crystal structure of the tip of the emitter is stored in advance in the storage unit, and
   wherein the control unit displays the guide image on the display unit as an overlapping image of a luminescence spot of the acquired FIM image.

2. The focused ion beam apparatus according to claim 1, wherein the control unit automatically determines whether or not an actual crystal structure of the tip of the emitter read from the FIM image coincides with the crystal structure displayed by the guide image after the acquired FIM image and the guide image are arranged to overlap each other.

3. The focused ion beam apparatus according to claim 2, wherein if a non-coincidence is determined, the control unit controls the extraction power source unit so that the extraction voltage changes with a predetermined amplitude.

4. The focused ion beam apparatus according to claim 3, wherein if non-coincidence is determined after the extraction voltage has been changed, the control unit operates the heating unit to a first temperature to perform the rearrangement of atoms of the emitter a second time.

5. The focused ion beam apparatus according to claim 4, wherein if non-coincidence is still determined after the heating unit is operated to the first temperature, the control unit operates the heating unit to a second temperature to perform the rearrangement of atoms of the emitter a third time, wherein the second temperature is greater than the first temperature.

6. The focused ion beam apparatus according to claim 1, wherein a heating sequence is stored in advance in the storage unit, and the heating unit is activated on the basis of the heating sequence.

7. The focused ion beam apparatus according to claim 1, wherein the guide image includes a structure display mark showing an atomic structure arrayed at a foremost end in the crystal structure of the tip of the emitter.

8. The focused ion beam apparatus according to claim 7, wherein an extraction voltage where a pattern corresponding to each of the marks begins to appear is stored in the storage unit along with the guide image, and the control unit displays each of the marks along with the stored extraction voltage.

9. The focused ion beam apparatus according to claim 1, wherein the guide image includes a plurality of line marks that extend along ridgelines of the crystal structure of the tip of the emitter.

10. The focus ion beam apparatus according to claim 9, wherein an extraction voltage where a pattern corresponding to each of the marks begins to appear is stored in the storage unit along with the guide image, and the control unit displays each of the marks along with the stored extraction voltage.

11. The focused ion beam apparatus according to claim 1, wherein the guide image includes hierarchical marks showing atoms arrayed at a second stage and following stages in the crystal structure of the tip of the emitter, and the hierarchical marks comprise marks that are different from each other at every stage.

12. The focus ion beam apparatus according to claim 11, wherein an extraction voltage where a pattern corresponding to each of the marks begins to appear is stored in the storage unit along with the guide image, and the control unit displays each of the marks along with the stored extraction voltage.

13. The focused ion beam apparatus according to claim 1, wherein the image acquiring mechanism comprises a multi-channel plate, a fluorescence screen, and a mirror positioned in the focused ion beam, and a CCD camera configured to receive an FIM image from the mirror and transmit the image to the control unit.

14. The focused ion beam apparatus according to claim 1, wherein the image acquiring mechanism comprises an aligner having members adjacent to the focused ion beam that generate a scan signal, an aperture in the focused ion beam between the aligner and the sample, and a secondary charged particle detector that generates a detection signal and is electrically coupled to the control unit, wherein the control unit synchronizes the scan signal and the detection signal to form an FIM image.

* * * * *